(12) United States Patent
Matsuno et al.

(10) Patent No.: US 8,138,426 B2
(45) Date of Patent: Mar. 20, 2012

(54) MOUNTING STRUCTURE

(75) Inventors: Koso Matsuno, Osaka (JP); Hidenori Miyakawa, Osaka (JP); Shigeaki Sakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 662 days.

(21) Appl. No.: 12/261,368

(22) Filed: Oct. 30, 2008

(65) Prior Publication Data

US 2009/0116203 A1    May 7, 2009

(30) Foreign Application Priority Data

Nov. 5, 2007  (JP) ................................. 2007-287673

(51) Int. Cl.
*H05K 1/11* (2006.01)
(52) U.S. Cl. ........................................ 174/261; 174/260
(58) Field of Classification Search ................... 174/255, 174/260, 261; 361/760, 761; 257/787, 777
See application file for complete search history.

(56) References Cited

U.S. PATENT DOCUMENTS

| | | | |
|---|---|---|---|
| 6,109,507 A | 8/2000 | Yagi et al. | |
| 7,575,955 B2* | 8/2009 | Attarwala | 438/118 |
| 2005/0082680 A1* | 4/2005 | Liu et al. | 257/777 |
| 2005/0151269 A1 | 7/2005 | Song et al. | |
| 2005/0176310 A1* | 8/2005 | Kataoka et al. | 439/876 |
| 2010/0244283 A1* | 9/2010 | Tsukahara et al. | 257/787 |

FOREIGN PATENT DOCUMENTS

| | | |
|---|---|---|
| JP | 2002-280407 | 9/2002 |
| JP | 2003-163232 | 6/2003 |
| JP | 2004-063679 | 2/2004 |
| JP | 2006-294835 | 10/2006 |
| JP | 2007-220940 | 8/2007 |

OTHER PUBLICATIONS

Korean Office Action issued in Korean Patent Application No. 10-2008-0108889, mailed Feb. 28, 2011.
Chinese Office Action issued in Chinese Patent Application No. 200810174448.X, dated Jun. 7, 2010.

* cited by examiner

*Primary Examiner* — Yuriy Semenenko
(74) *Attorney, Agent, or Firm* — McDermott Will & Emery LLP

(57) ABSTRACT

A mounting structure is provided that can suppress flux from spreading, secure a connecting strength between a circuit board and an electronic component with underfill, and achieve a stable electrical connection between lands and terminals. The mounting structure is configured with a flat electronic component and a circuit board, and a plurality of lands provided on the undersurface of the electronic component and a plurality of terminals provided on the mounting surface of the circuit board so as to correspond to the plurality of lands are bonded with solder. The circuit board includes a means for holding flux separated from the solder in the proximity of at least one of the plurality of terminals.

14 Claims, 10 Drawing Sheets

MOUNTING STRUCTURE

FIELD OF THE INVENTION

The present invention relates to mounting structures in which an electronic component, such as a semiconductor element, is mounted on the mounting surface of a circuit board. More specifically, the present invention relates to a mounting structure in which underfill is injected in the gap between a circuit board and an electronic component in order to reinforce solder joints.

BACKGROUND OF THE INVENTION

In recent years, electronic devices are becoming multifunctional, smaller in size and lighter in weight. In particular, there is a strong demand for smaller, lighter and thinner mobile electronic devices, such as mobile phones and digital still cameras, because these devices are carried by people. As a mounting technique that satisfies this demand, mounting structures have been developed in which a primary electronic component, such as a semiconductor element, is mounted on a multilayer circuit board.

A typical mounting structure includes a structure in which an LGA (land grid array) package, which is one type of semiconductor packages, is mounted on a multilayer circuit board. In an LGA package, planar electrodes called lands are arranged in a matrix on the undersurface of an interposer board onto which a semiconductor chip is fixed.

FIG. 11 shows an external view of a conventional mounting structure MSp in which a flat LGA package is mounted on the mounting surface of a circuit board. FIG. 12 shows part of a cross section of the conventional mounting structure MSp, taken along the line XII-XII of FIG. 11. Underfill is injected into the gap between a circuit board 1p and the LGA package 2 in order to reinforce solder connection, but FIGS. 11 and 12 show a state before the underfill is injected.

Lands 21 are formed in a matrix on the undersurface of the LGA package 2. On the mounting surface Sm of the circuit board 1p, terminals 11 arranged in a matrix that correspond to the lands 21 of the LGA package 2 and a wiring pattern (not shown) connected to the terminals 11 are formed. Although not shown, three-dimensional multilayer wiring having through holes is formed inside the circuit board 1p.

A process for manufacturing the conventional mounting structure MSp will be described next briefly. First, a solder paste containing flux is applied onto the terminals 11 of the circuit board 1p by screen printing or the like. Then, the LGA package 2 is placed on the circuit board 1p with the side on which the lands 21 are formed facing down.

At this time, the terminals 11 of the circuit board 1p and the lands 21 of the LGA package 2, provided at a predetermined pitch, are positioned so as to face each other with solder paste therebetween. Subsequently, the solder paste is heated in a reflow oven to join the terminals 11 and the lands 21 with solder 3.

Next, underfill is injected into the gap between the circuit board 1p and the LGA package 2c thus connected. As shown in FIG. 11, a solution containing underfill 4 is dripped on the boundary between the circuit board 1p and the LGA package 2. Then, the underfill 4 permeates between the circuit board 1p and the LGA package 2 by capillarity, and fills the gap except for the solder joints 3.

Subsequently, the underfill 4 is heated and cured to reinforce the connection achieved with the solder between the circuit board 1p and the LGA package 2. In this manner, the mounting structure MSp is obtained.

With the above-described conventional mounting structure MSp, a case may arise where the permeation of the underfill 4 is hindered by residual flux seeped out from the solder joints 3 when injecting the underfill 4 into the gap between the LGA package 2 and the circuit board 1p, and a sufficient connecting strength between the circuit board 1p and the LGA package 2 cannot be obtained.

Specifically, because the gap (standoff) between the circuit board 1p and the LGA package 2 is as extremely small as about 100 μm, liquid flux seeped out from the solder paste may spread to the space in the proximity of the terminal 11 by capillarity during a reflow process, and the space between adjacent terminals 11 may be filled with the flux. After evaporation of solvent, the solid content of the flux that has spread to the mounting surface Sm of the circuit board 1p remains as residual flux. The residual flux left in the gap between the circuit board 1p and the LGA package 2 as described above hampers the connection between the circuit board 1p and the LGA package 2 with the underfill 4.

The state of flux 5 when the mounting structure MSp is in a reflow process will now be described in detail with reference to FIG. 13. Similarly to FIG. 12, (A) to (E) in FIG. 13 show partial enlarged views of a cross section of the mounting structure MSp, which respectively correspond to soldering steps in a reflow process.

The solvent contained in the flux eventually evaporates, so that only residual flux remains on the circuit board 1p. Ordinarily, an alcohol is used as the solvent, but since the content is several percent, there is almost no change in the flux shape between before and after evaporation of the solvent. Hereinafter, flux in a liquid state is referred to as flux 5, and flux in a solid state after the solvent has evaporated is referred to as a residual flux 5d to distinguish them from each other.

When temperature is increased to the melting temperature of the solder joints 3, as shown in (A) of FIG. 13, flux 5 separated from the solder joints 3 as a result of the temperature rise seeps out. If the amount of the seeped flux 5 is small, the flux 5 travels over the surface of the solder joints 3 and reaches the terminal 11 of the circuit board 1p, but it does not reach the circuit board 1p.

If the amount of the flux 5 seeped out from the solder joints 3 is large, as shown in (B) of FIG. 13, the flux 5 reaches the circuit board 1p and spreads around the terminal 11.

The flux 5 seeped out from the adjacent solder joints 3 eventually merges on the circuit board 1p, forming a kind of coating that partially covers the surface of the circuit board 1p as shown in (C) of FIG. 13.

If more flux 5 seeps out from the solder joints 3, as shown in (D) of FIG. 13, the coating increases in area and thickness, and piles up in the space between the adjacent solder joints 3.

The coating continues to increase in thickness, and finally, as shown in FIG. 13E, it fills locally between the LGA package 2 and the circuit board 1p.

At the time when the reflow process is finished, flux 5 is left around the solder joints 3 in any one of the states shown in (A) to (E) of FIG. 13. Hereinafter, the states of flux shown in FIGS. 13A to 13E are referred to as FR1, FR2, FR3, FR4 and FR5, respectively, as indicated on the right side of the diagrams, in order to distinguish them from each other.

As described above, before underfill 4 is injected, residual flux 5d exists inside the mounting structure MSp in any one of the states FR1 to FR5. The effect of underfill 4 for reinforcing the mounting structure MSp will be described below briefly for each of the states FR1 to FR5 of the residual flux 5d.

In the case of FR1 (see (A) in FIG. 13), the residual flux 5d stays at the terminal 11 and has not reached the circuit board 1p. Accordingly, the circuit board 1p and the LGA package 2 will be bonded completely with the underfill 4. After being cured, the underfill 4 adheres to the surface of the solder joint 3, and retains the shape of the solder joint 3. The greatest reinforcing effect of the underfill 4 on the mounting structure MSp is obtained in this case.

In the case of FR2 (see (B) in FIG. 13), the residual flux 5d has seeped out from the terminal 11 onto the circuit board 1p, but there is a region in which the residual flux 5d does not exist in the space between the adjacent solder joints 3 (terminals 11). In this case, the underfill 4 can adhere only partially to the circuit board 1p, but it can adhere completely to the LGA package 2. Furthermore, the function for retaining the shape of the solder joint 3 is also achieved. Accordingly, in the case of FR2, the circuit board 1p and the LGA package 2 are bonded relatively strongly although the strength is lower than that of the case of FR1. Thus, the effect of underfill 4 for reinforcing the mounting structure MSp is the greatest after FR1.

In the case of FR3 (see (C) in FIG. 13), the surface of the circuit board 1p is covered with residual flux 5d in the form of a coating. Accordingly, the underfill 4 can adhere to the LGA package 2, but it cannot adhere to the circuit board 1p. The function of underfill 4 for retaining the shape of the solder joint 3 itself is effective. However, it is difficult to say that the effect of underfill 4 for reinforcing the mounting structure MSp is effective because the underfill 4 does not adhere to the circuit board 1p, although the effectiveness is the greatest after FR2.

In the case of FR4 (see (D) in FIG. 13), the situation is similar to that of the case of FR3, but the function of underfill 4 for retaining the shape of the solder joint 3 cannot be achieved. Accordingly, the effect of underfill 4 for reinforcing the mounting structure MSp is lower than that of the case of FR3.

In the case of FR5 (see (E) in FIG. 13), the gap between the circuit board 1p and the LGA package 2 is completely filled with the residual flux 5d, so that the underfill 4 cannot enter. That is, the circuit board 1p and the LGA package 2 will not be bonded by the underfill 4. Accordingly, the effect of underfill 4 for reinforcing the mounting structure MSp is not obtained.

FIG. 14 shows an example of the mounting structure MSp obtained by curing after allowing underfill 4 to permeate when residual flux 5d exists in any one of the states FR1 to FR5, which is viewed in the direction indicated by the arrow A of FIG. 11 after the LGA package 2 has been removed from the mounting structure MSp shown in FIG. 11. Although wires are attached to some of the terminals 11, the wires are not shown in FIG. 14 for the sake of clarity.

In this example, residual flux 5d has spread in three regions (R1, R2, R3) on the mounting surface Sm of the circuit board 1p. The flux spread region R1 extends over ten solder joints 3 (terminals 11), and the flux spread regions R2 and R3 extend over three solder joints 3 (terminals 11).

FIG. 15 shows the cross section of the mounting structure MSp of FIG. 14 in which filling and curing of underfill 4 has been performed, taken along the XV-XV line of FIG. 14. In FIG. 15, the region shown on the far left that is outside the flux spread region R1 is a region in which residual flux 5d exists in the state FR1, or in other words, a region in which residual flux 5d does not exist except the terminal 11. Accordingly, the circuit board 1p and the LGA package 2 are bonded by the underfill 4, and the shape of the solder joint 3 is retained by the underfill 4. Such a region is referred to as a residual flux region P(FR1).

Around solder joints 3 located at the ends of the flux spread region R1, residual flux 5d exists in the FR2 state. In other words, a partial coating of residual flux 5d is formed. The underfill 4 adheres partially to the circuit board 1p and completely to the LGA package 2, and retains the shape of the solder joint 3. Such a region is referred to as a residual flux region P(FR2).

Between a solder joint 3 located at an end of the flux spread region R1 and a solder joint 3 adjacent thereto, residual flux 5 exists in the FR3 state. In other words, the circuit board 1p is covered completely by a relatively thin coating of residual flux 5d. The underfill 4 adheres completely to the LGA package 2, but it cannot adhere to the circuit board 1p. The underfill 4 retains the shape of the solder joint 3. Such a region is referred to as a residual flux region P(FR3).

Between a solder joint 3 located at the center portion of the flux spread region R1 and a solder joint 3 adjacent thereto, residual flux 5d exists in the FR4 state. In other words, the circuit board 1p is covered with a relatively thick coating of residual flux 5d. The underfill 4 adheres completely to the LGA package 2, but it cannot adhere to the circuit board 1p. The underfill 4 can retain only part of the shape of the solder joint 3. Such a region is referred to as a residual flux region P(FR4).

Between adjacent solder joints 3 located at the center portion of the flux spread region R1, residual flux 5d exists in the FR5 state. In other words, the space between the circuit board 1p and the LGA package 2 is filled with residual flux 5d. Accordingly, the underfill 4 cannot adhere to the circuit board 1p and the LGA package 2, and it cannot retain the shape of the solder joints 3. Such a region is referred to as a residual flux region P(FR5).

If portions, such as the region P(FR5), that are clogged with residual flux dot the circuit board 1p, the underfill 4, when permeating by capillarity, spreads in multiple directions so as to avoid the portions clogged with residual flux. As a result, although not shown in the example of FIG. 14, air is trapped in the gap in some places, creating air bubbles. The trapped air (air bubbles) expands when heating and curing the underfill 4, and forces out the underfill 4. Consequently, the contact areas between the underfill 4 and the circuit board 1p and between the underfill and the LGA package 2 are reduced, and therefore a sufficient connection strength cannot be secured.

As described above, if residual flux 5d separated from the solder exists between the terminals 11 of the circuit board 1p, filling of the underfill 4 is prevented by the residual flux 5d, and therefore a sufficient connection strength cannot be secured between the circuit board 1p and the LGA package 2. In addition, the function of underfill 4 for retaining the shape of the solder joints 3 cannot be exhibited sufficiently.

To solve the above problems, a method is conceivable in which the residual flux is removed by washing the mounting structure MSp after the soldering step in the reflow process is finished. However, the inclusion of a residual flux washing step makes the manufacturing process complicated, and substances produced during washing of the residual flux can cause environmental damage. It is therefore desirable to perform soldering without washing residual flux.

As a method for injecting underfill between a circuit board and a package without washing residual flux while securing a sufficient connection strength, Japanese Laid-Open Patent Publication No. 2006-294835 proposes to provide air vents that pass through the circuit board.

However, the flux separated from the solder is liquid, and thus the liquid flux flows from the flux source (solder joints) to the air vents. That is, the flux spreads over the circuit board, and after having passed therethrough, residual flux is left.

Furthermore, in order to suppress residual flux, it is necessary to increase the number of air vents as well as the diameter of the air vents. Even if the ejection of liquid flux is facilitated, however, the underfill is ejected from the air vents to the outside in the underfill injection step. As a result, an amount of underfill sufficient to reinforce the connection strength between the circuit board and the electronic component may not be obtained.

BRIEF SUMMARY OF THE INVENTION

In view of the above circumstances, it is an object of the present invention to provide a mounting structure that can secure the connecting strength between a circuit board and an electronic component with underfill, thereby achieving a stable electrical connection between lands and terminals.

In order to achieve the above object, a mounting structure according to the present invention is a mounting structure including a flat electronic component including a plurality of lands provided on the undersurface of the electronic component, and a circuit board including a plurality of terminals provided on the mounting surface of the circuit board so as to correspond respectively to the plurality of lands, the plurality of terminals and the plurality of lands being respectively bonded together with solder, wherein the circuit board further comprises a flux holding means for holding flux separated from the solder, the flux holding means being provided in the proximity of at least one of the plurality of terminals of the circuit board.

With the mounting structure according to the present invention, it is possible to suppress the flux seeped out from the solder during a reflow process from spreading to the mounting surface of a circuit board. As a result, it is possible to secure a sufficient connection strength between the circuit board and the electronic component by the underfill.

While the novel features of the invention are set forth particularly in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
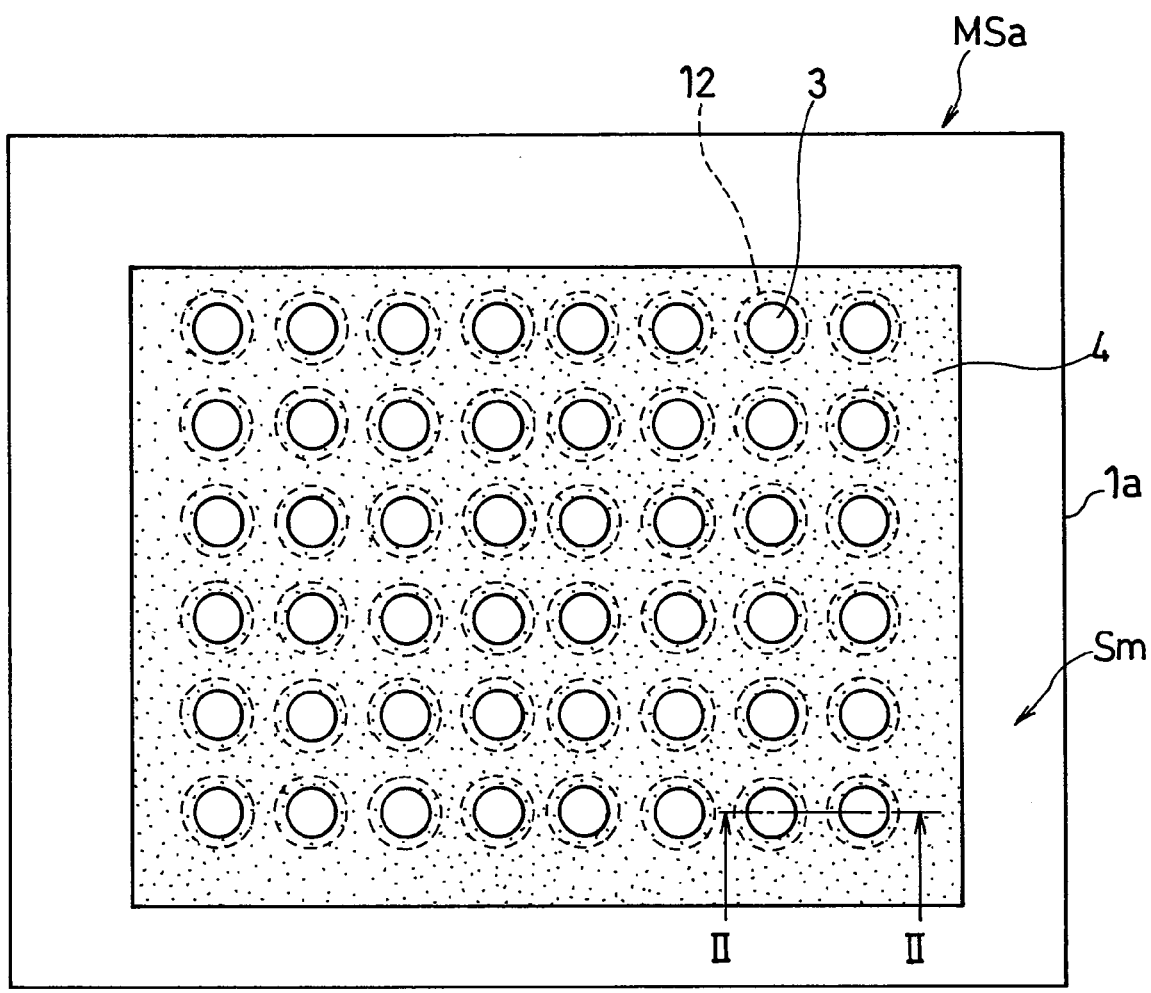
FIG. 1 is a plan view of a mounting structure according to Embodiment 1 of the present invention, from which an electronic component has been removed.

Before describing mounting structures according to embodiments of the present invention, features of a mounting structure of the present invention will be described. A mounting structure of the present invention has a configuration similar to that of a conventional mounting structure as described above, except for the circuit board. A circuit board of the present invention includes a means that is not included in conventional circuit boards, namely, a means for holding flux separated from the solder during a reflow process.

With such a means, it is possible to suppress flux from spreading into the gap between the mounting surface of the circuit board and the undersurface of the electronic component. As a result, the contact area of the underfill with the mounting surface of the circuit board and with the undersurface of the LGA package can be secured. Thus, the function of the underfill for reinforcing the connection strength between the circuit board and the electronic component can be exhibited sufficiently.

Hereinafter, embodiments of the present invention will be described with reference to the accompanying drawings. In the drawings, components having the same function as those of a conventional mounting structure are assigned the same reference numerals, and a description thereof is omitted.

Embodiment 1

Figure 2:
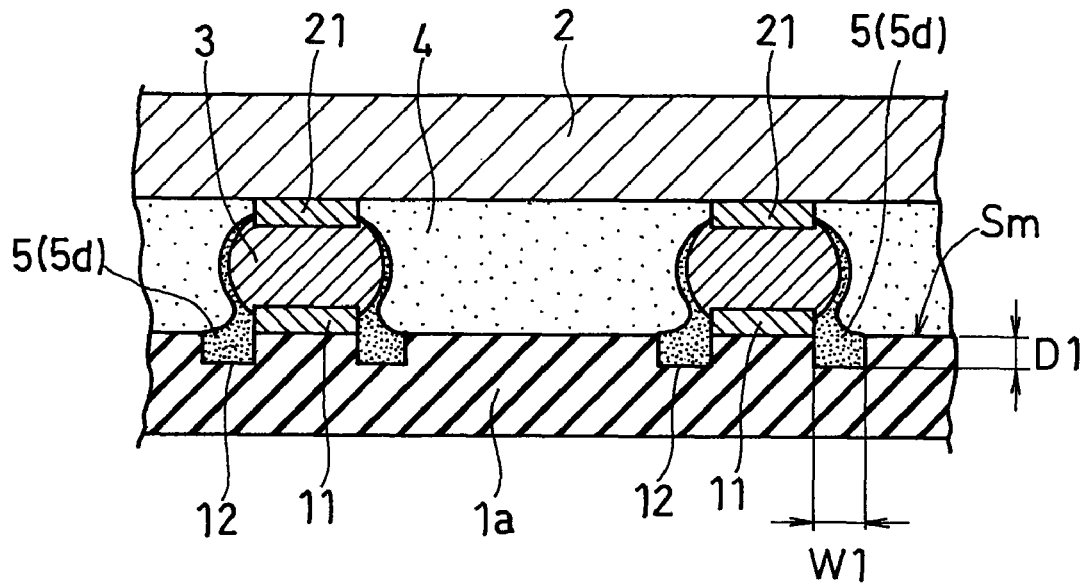
FIG. 2 is a cross-sectional view of a relevant part of the mounting structure according to Embodiment 1 of the present invention, taken along the line II-II of FIG. 1.

A mounting structure according to Embodiment 1 of the present invention will be described with reference to FIGS. 1, 2 and 3. In a mounting structure MSa according to Embodiment 1, an LGA package 2 is mounted on the mounting surface of a circuit board 1a, as in the conventional mounting structure MSp (see FIG. 11). FIG. 1 shows the mounting structure MSa of Embodiment 1, from which the LGA package 2 has been removed. FIG. 2 shows a cross section of a relevant part of the mounting structure MSa, taken along the line II-II of FIG. 1.

Figure 3:
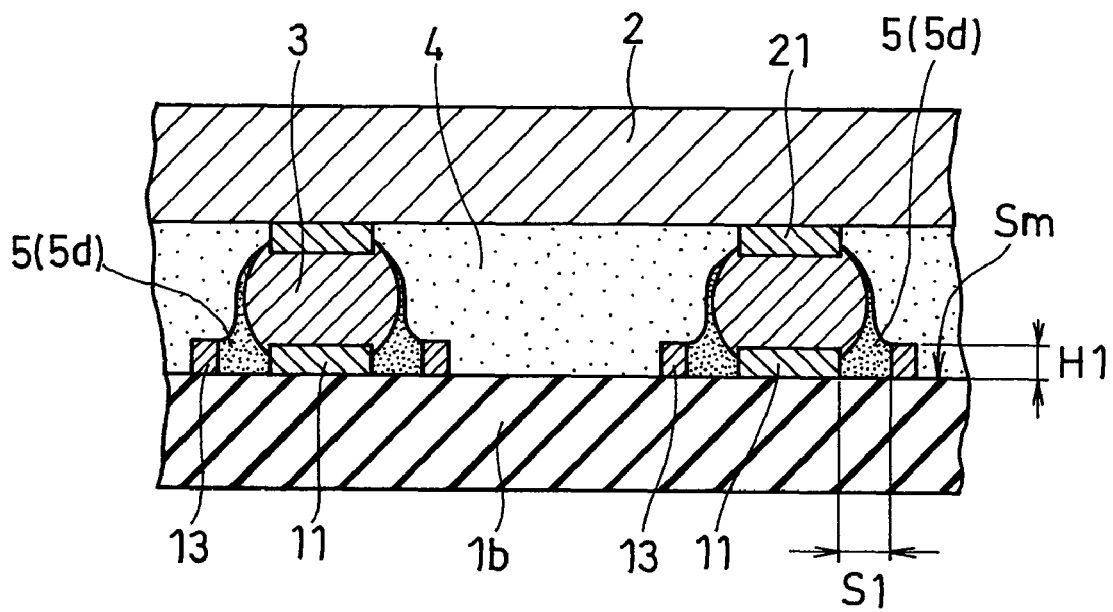
FIG. 3 is a cross-sectional view of a relevant part of a mounting structure according to a variation of Embodiment 1.

Although electric connecting wires are attached to some terminals 11, the wires are omitted in FIGS. 1 to 3 for the sake of clarity. Likewise, three-dimensional wiring having through holes is formed inside the circuit board 1a, but the wiring is omitted in the drawings since it does not directly relate to the present invention.

Lands 21 of the LGA package 2 that are formed in a matrix and terminals 11 of the circuit board 1a that are formed in a matrix as well are bonded with solder, forming solder joints 3. Ordinarily, the lands have a diameter of 0.3 to 0.6 mm, and the land pitch is 0.5 to 1 mm. The lands 21 have, for example, a W/Ni/Au laminate structure in which an approximately 10 μm thick W layer and an approximately 5 μm thick Ni layer are laminated in this order from the surface of the package and the surface is covered with an approximately 0.6 μm thick Au plating. The terminal 11 is formed of Cu or Cu that is plated with tin, zinc, nickel or gold, and has a thickness of 20 to 70 μm. The solder contains Sn.

As shown in FIG. 1, ring-shaped grooves 12 for holding flux 5 seeped out from the solder joints 3 during a reflow process are formed around the terminals 11 on the mounting surface Sm of the circuit board 1a. As shown in FIG. 2, flux 5 that has traveled over the surface of the solder joint 3 and reached the terminals 11 flows into the grooves 12 and is held therein. Accordingly, the flux 5 is prevented from spreading over the mounting surface Sm of the circuit board 1a. As a result, it is possible to prevent the states FR2 to FR5 of residual flux mentioned with reference to FIGS. 13B to 13E from occurring.

The depth D1 and width W1 of the ring-shaped grooves 12 (see FIG. 2) need to be adjusted according to the amount of flux 5. That is, it is necessary to adjust the capacity of a ring-shaped groove 12 to a capacity that can hold flux 5 separated from a single solder joint 3 and that can prevent the flux 5 from spreading over the mounting surface. If the width W1 is too large, the contact area between the underfill 4 and the circuit board 1a will be small, which is not preferable. If the depth D1 of the ring-shaped groove 12 is too large, the mechanical strength of the circuit board 1a will be lowered, which is not preferable. When mounting a LGA package 2 of conventional specifications on the circuit board 1a, it is preferable that the ring-shaped grooves 12 have a depth D1 of 5 to 50 μm and a width W1 of 50 to 500 μm.

A method for manufacturing the mounting structure MSa will be described next. First, a method for manufacturing the circuit board 1a will be described. As stated earlier, a multilayer circuit board in which three-dimensional wiring is formed is ordinarily used as a circuit board for a mounting structure. A multilayer circuit board is produced by laminating a prepreg, a copper foil and the like, after that, forming vias or through holes by drilling or laser processing, and protecting the surface with a resist. However, the internal structure of the circuit board does not directly relate to the present invention. Accordingly, the present embodiment will be described in the context of producing a circuit board that includes an insulating layer of a single-layer structure as an example, for the sake of simplicity.

A prepreg is produced by impregnating a glass cloth, which is a reinforcing material, with a thermosetting resin, such as an epoxy resin, that has excellent heat resistance, dielectric properties, insulating properties and processability.

Next, a copper foil is attached to one surface of the prepreg. After that, the prepreg is pressed and heated by a pressing machine with both sides of the prepreg sandwiched by the pressing machine to cure the resin and fix the copper foil to the resin.

Then, photolithography and etching are performed to process the copper foil attached to the surface of the resin substrate, forming a wiring pattern that includes terminals 11.

Next, laser light is applied to predetermined areas of the resin substrate to form ring-shaped grooves having a predetermined depth. In this manner, a circuit board 1a in which a wiring pattern and ring-shaped grooves 12 are formed is obtained.

Subsequently, a solder paste is applied onto the terminals 11 of the circuit board 1a thus obtained by screen printing, and an LGA package 2 is placed on the circuit board 1a such that the lands 21 face the terminals 11.

A mounting structure MSa in which the LGA package 2 is temporarily fixed to the circuit board 1a is subjected to a reflow process, thereby to join the terminals 11 of the circuit board 1a and the lands 21 of the LGA package 2 with solder.

Next, underfill 4 is injected into the gap between the circuit board 1a and the LGA package 2. In the same manner as described with reference to FIG. 11, a solution containing underfill 4 is dripped on the boundary between the circuit board 1a and the LGA package 2. Ordinarily, the underfill 4 has a viscosity of 10 Pa·s or lower. It is also possible to heat the underfill 4 to several tens of degrees centigrade for application.

The liquid underfill 4 permeates between the circuit board 1a and the LGA package 2 by capillarity and spreads out. Because residual flux 5d is held in the ring-shaped grooves 12 formed around the terminals 11, the permeation of the underfill 4 is not hindered. The underfill 4 that has permeated between the circuit board 1a and the LGA package 2 is then heated and cured, thereby functioning to mechanically connect the circuit board 1a and the LGA package 2 and retaining the shape of the solder joints 3. In this manner, a mounting structure MSa is obtained.

FIG. 3 shows a mounting structure MSa according to a variation of the present embodiment, in which the circuit board 1a of FIG. 2 is replaced by a circuit board 1b. In the circuit board 1b, ring-shaped walls 13 are formed so as to surround the terminals 11 as a means for holding flux 5. The ring-shaped walls 13 are formed to have a rectangular cross section.

The function of the ring-shaped walls 13 is the same as that of the ring-shaped grooves 12. That is, the flux 5 separated from the solder joint 3 is held in a portion surrounded by the ring-shaped wall 13 when heating the solder paste, so that the flux 5 is prevented from spreading to the space between adjacent terminals 11. The height H1 of the ring-shaped wall 13 and the spacing S1 between the wall and the terminal 11 can be set as appropriate according to the amount of flux held, as in the ring-shaped grooves 12.

A method for forming the wall 13 on the mounting surface Sm of the circuit board 1b will be described briefly. Ordinarily, the wiring pattern of the circuit board 1b is formed by subjecting a copper foil attached to the mounting surface Sm of the circuit board 1b to a photolithography process and an etching process. At this time, part of the copper foil is left so that the walls 13 can be formed as well.

Embodiment 2

Figure 4:
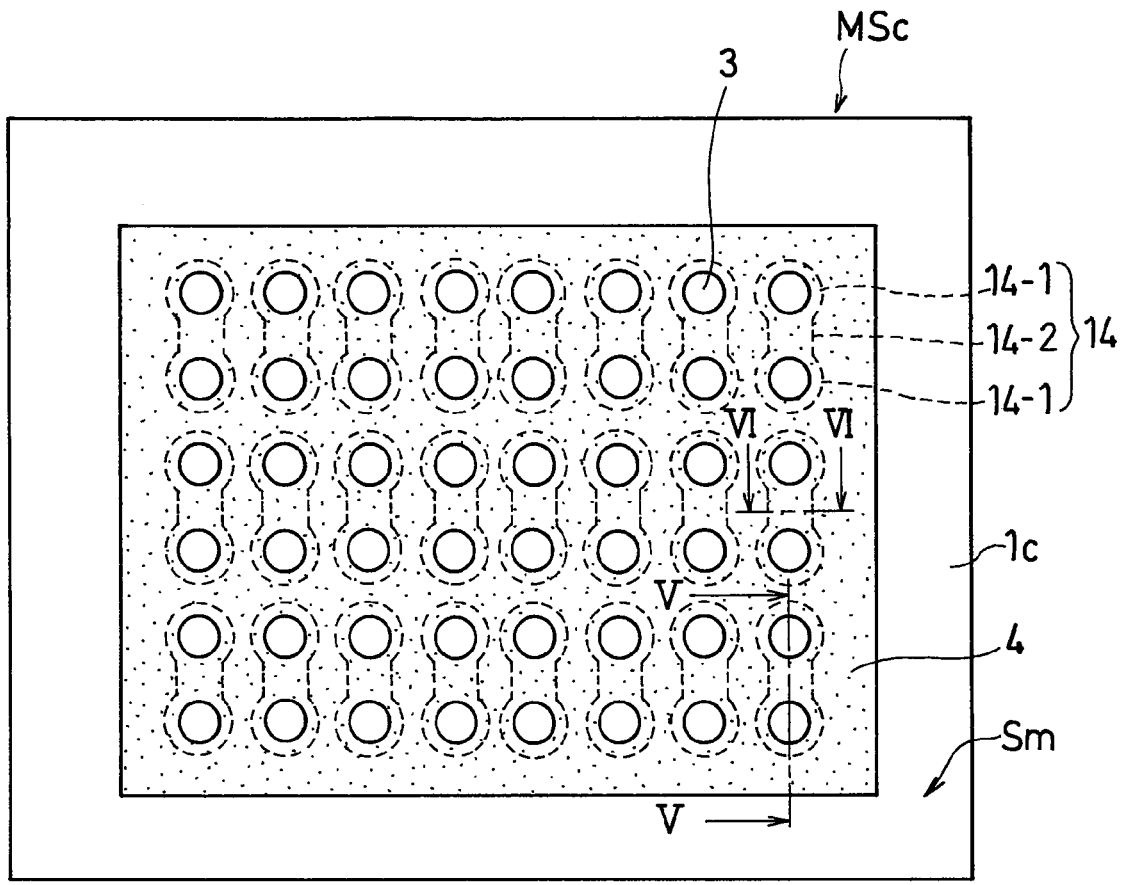
FIG. 4 is a plan view of a mounting structure according to Embodiment 2 of the present invention, from which an electronic component has been removed.
Figure 5:
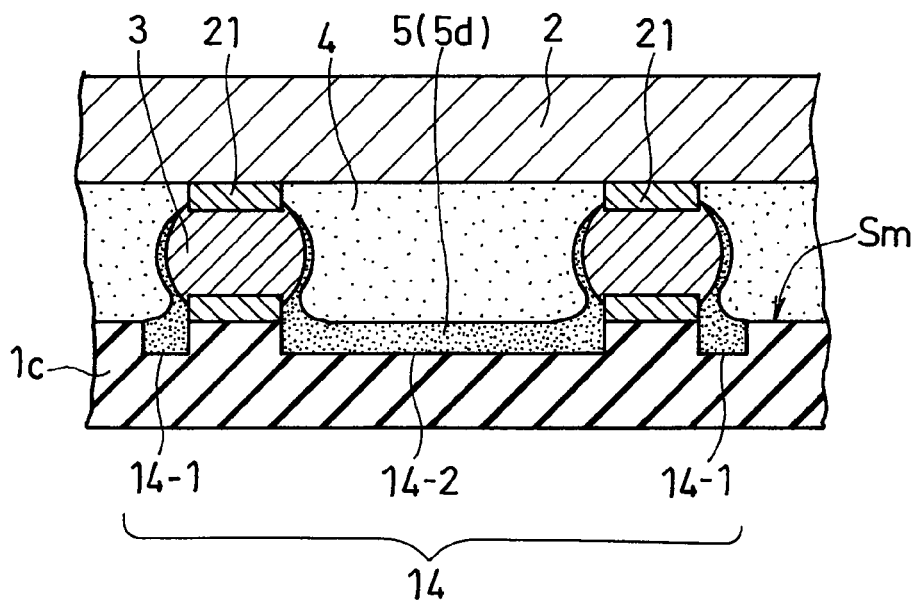
FIG. 5 is a cross-sectional view of a relevant part of the mounting structure according to Embodiment 2, taken along the V-V line of FIG. 4.

A mounting structure according to Embodiment 2 of the present invention will be described with reference to FIGS. 4 and 5. FIG. 4 shows a mounting structure MSc according to the present embodiment, from which an LGA package 2 has been removed, as in FIG. 1. FIG. 5 shows a cross-sectional view of a relevant part of the mounting structure MSc, taken along the line V-V line of FIG. 4.

Embodiment 1 employs, as a means for holding residual flux 5d, a ring-shaped groove formed around a terminal 11 of the circuit board 1a, or the space surrounded by a ring-shaped wall 13 formed around a terminal 11 of the circuit board 1b.

In the present embodiment, as a means for holding flux 5, a connecting groove 14 is used in which two adjacent ring-shaped grooves are connected by a single rectangular groove. In the connecting groove 14, two ring-shaped groove portions 14-1 that correspond to the ring-shaped grooves 12 are connected by a connecting groove portion 14-2.

Even if a large amount of flux that cannot be held in the ring-shaped grooves 12 (see FIG. 1) flows, the flux is guided to the connecting groove portion 14-2 via the ring-shaped groove portions 14-1, and held in the entire connecting groove 14. That is, if the capacity of the ring-shaped groove portions 14-1 is the same as that of the ring-shaped grooves 12, the capacity of the connecting groove 14 can be increased relative to the capacity of the ring-shaped groove 12 by an amount equal to half the capacity of the connecting groove portion 14-2. In other words, the capacity of the connecting groove 14 can be made equal to the capacity of the ring-shaped groove 12 by reducing the capacity of the ring-shaped groove portions 14-1 by an amount equal to half the capacity of the connecting groove portion 14-2.

Figure 15:
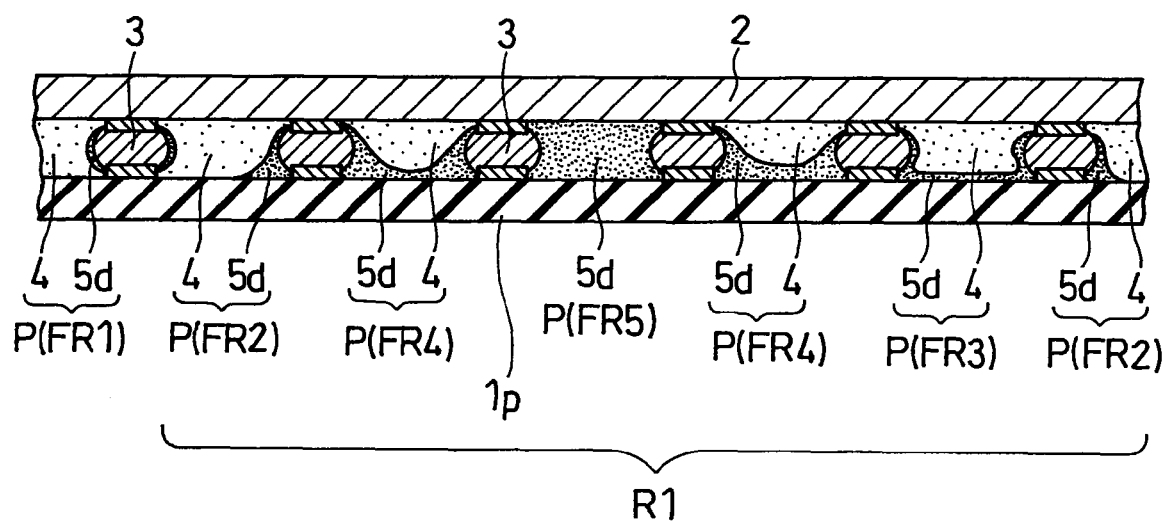
FIG. 15 is a cross-sectional view of a relevant part of the conventional mounting structure, taken along the XV-XV line of FIG. 14.

The flux 5 overflowed from the ring-shaped groove portions 14-1 is held in the rectangular connecting groove portion 14-2, and thus the effect of preventing the flux 5 from spreading can be enhanced. For example, even if the amount of residual flux 5 is large and a residual flux region P(FR2) and a residual flux region P(FR3) as shown in FIG. 15 above occur, the occurrence of these regions can be prevented even more effectively by containing the flux 5 within the connecting groove portion 14-2.

Figure 6A:
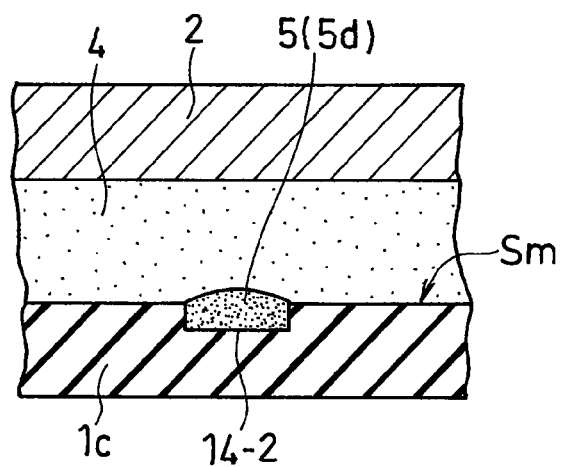
FIG. 6A is a cross-sectional view of a relevant part of the mounting structure according to Embodiment 2, taken along the VI-VI line of FIG. 4.
Figure 6B:
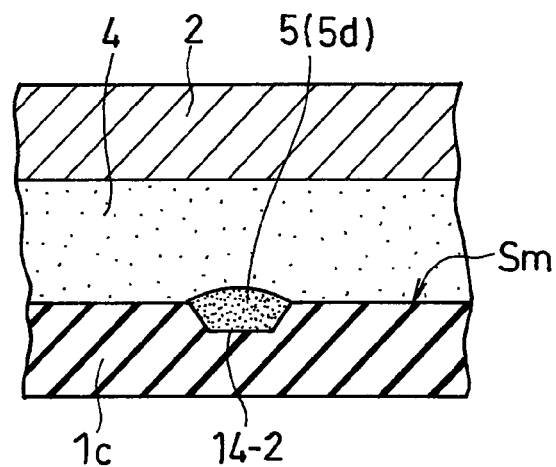
FIG. 6B is a cross-sectional view of a relevant part of a mounting structure according to a variation of Embodiment 2.

FIG. 6A shows a cross section in the transverse direction of the connecting groove portion 14-2, taken along the line VI-VI of FIG. 4. The groove wall of the connecting groove portion 14-2 is formed at a substantially right angle relative to the mounting surface Sm of the circuit board 1c. However, the groove wall of the connecting groove portion 14-2 may be formed at an obtuse angle relative to the mounting surface Sm of the circuit board 1c as shown in FIG. 6B.

There is no limitation on the orientation of the connecting grooves 14. However, taking the injection of underfill 4 into account, it is preferable that the connecting grooves 14 are disposed such that the longitudinal direction of the connecting grooves 14 is parallel to the permeating direction of the underfill 4. The reason for this will be described briefly.

Figure 11:
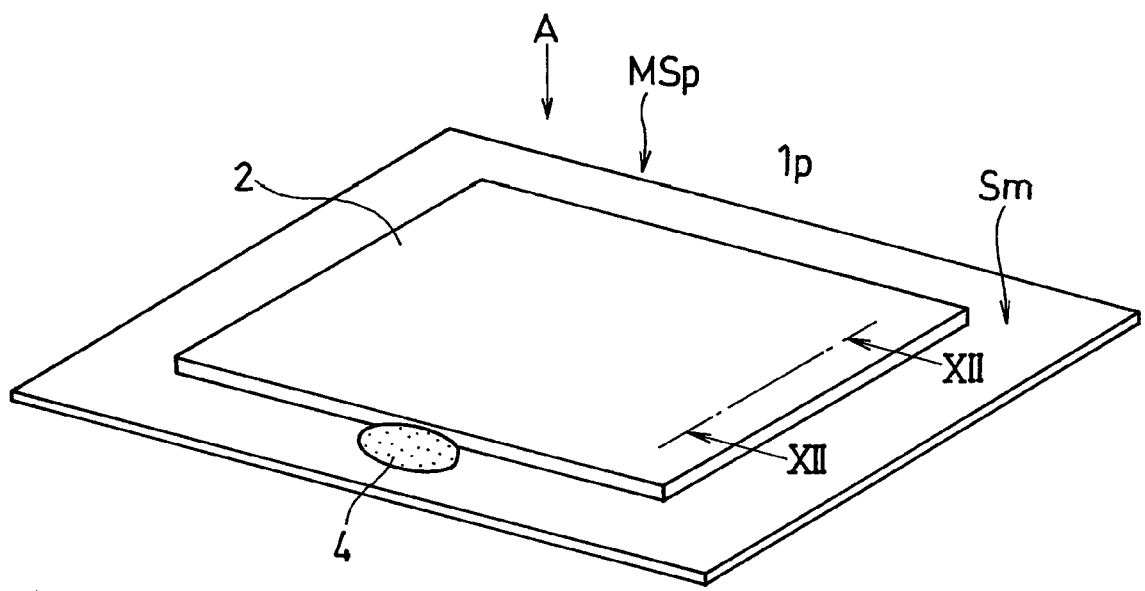
FIG. 11 is a perspective view showing an external view of a conventional mounting structure.
Figure 12:
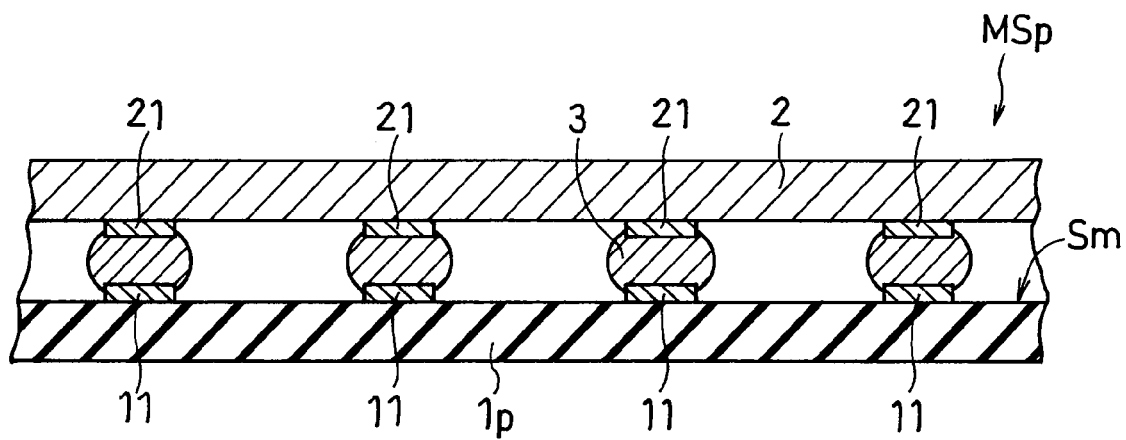
FIG. 12 is a cross-sectional view of a relevant part of the conventional mounting structure, taken along the line XII-XII line of FIG. 11.
Figure 13:
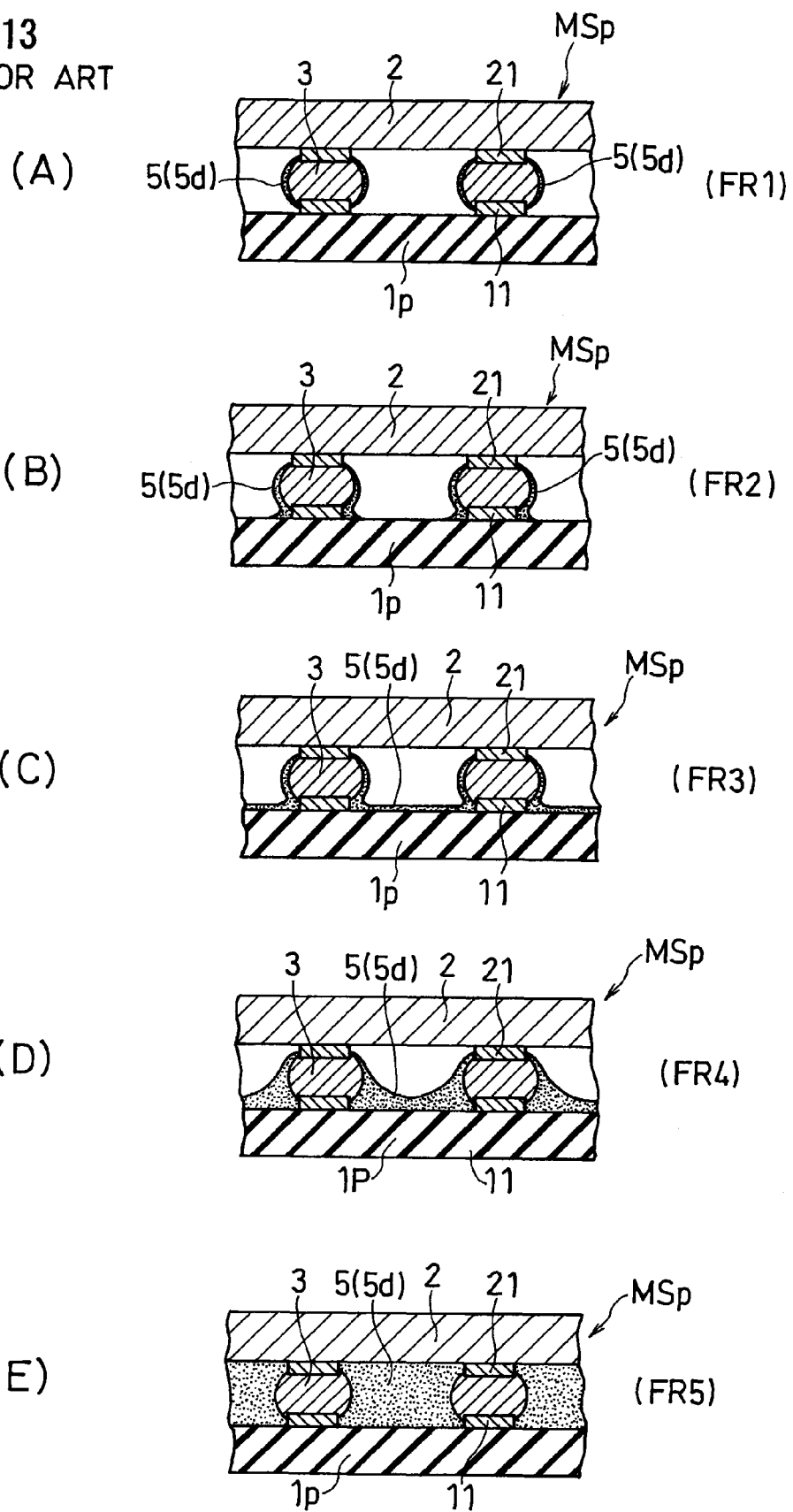
FIG. 13 is a diagram illustrating residual flux states in the conventional mounting structure shown in FIG. 12.
Figure 14:
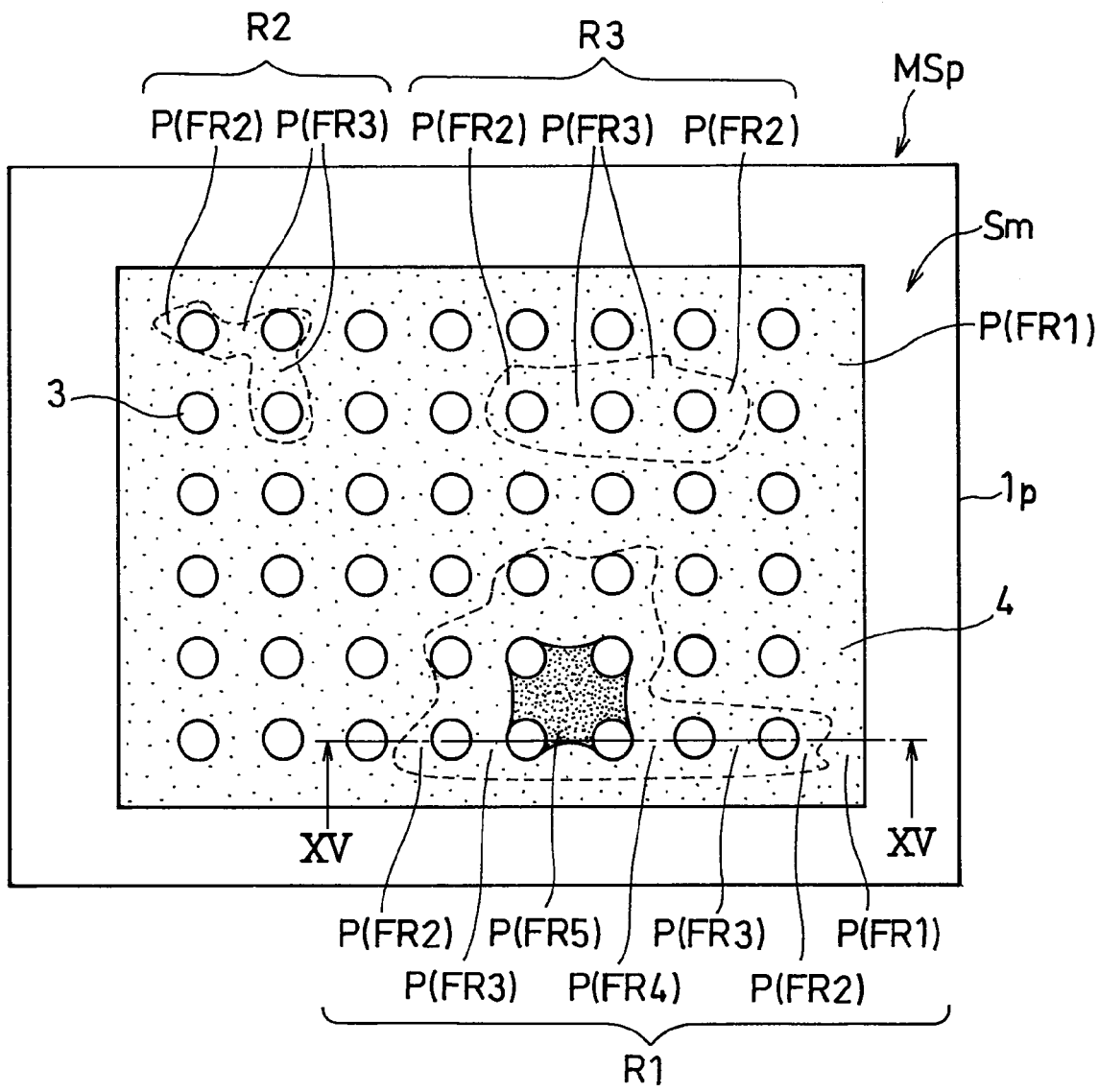
FIG. 14 is a plan view of the conventional mounting structure of FIG. 11, from which an electronic component has been removed.

The underfill 4 applied to the edge portion of the reflowed mounting structure MSc attempts to permeate radially between the circuit board 1c and the LGA package 2 by capillarity (see FIG. 11). When permeating, the underfill 4 must avoid the connecting grooves 14 provided in the circuit board 1c. Particularly when the connecting groove portions 14-2 are arranged in a direction perpendicular to the permeating direction of the underfill 4, they act as obstacles to the permeation of the underfill 4.

As a result, a difference occurs in permeating rate of the underfill 4 between the center portion and the periphery of the circuit board 1c, and air may be contained in the foremost portion in the permeating direction due to the underfill 4 permeating from a different direction. In a region in which air is contained, the reinforcing effect of the underfill 4 cannot be achieved. Accordingly, consideration is necessary when providing the connecting grooves 14 to ensure that the rate at which underfill 4 permeates the circuit board 1 does not differ significantly from place to place.

The circuit board 1c can be produced in the same manner as the circuit board 1a of Embodiment 1 is produced, and thus a description thereof is omitted here.

Figure 7A:
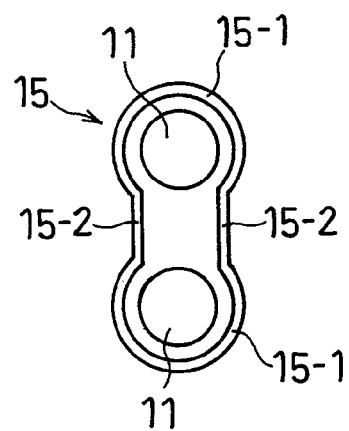
FIG. 7A is a plan view of a connecting wall of a mounting structure according to a variation of Embodiment 2.

Connecting grooves 14 according to variations of the present embodiment will be described with reference to FIGS. 7A and 7B. In the variation shown in FIG. 7A, two ring-shaped wall portions 15-1 that correspond to the ring-shaped walls 13 (see FIG. 3) are connected by two connecting wall portions 15-2, forming a connecting wall 15. Flux 5 is held in the space surrounded by these walls.

Figure 7B:
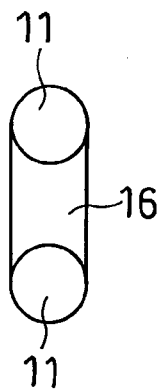
FIG. 7B is a plan view of a rectangular groove of a mounting structure according to a variation of Embodiment 2.

In the example shown in FIG. 7B, two ring-shaped groove portions 14-1 have been removed from the connecting groove 14. That is, a rectangular groove 16 that corresponds to the connecting groove portion 14-2 is formed so as to connect two adjacent terminals 11. The manufacture will be easy because the rectangular groove 16 has a simple shape. If the amount of flux separated from the solder joints 3 is small, even such grooves can exhibit sufficient effect as a means for holding flux 5. The capacity of the connecting wall 15 and that of the rectangular groove 16 can be set as appropriate according to the amount of flux 5 held therein.

Embodiment 3

Figure 8:
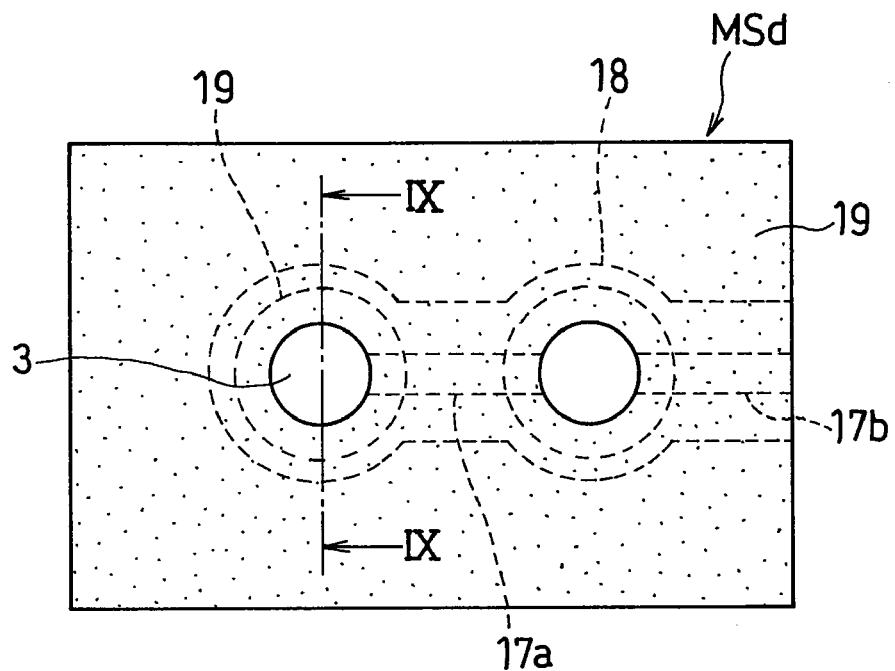
FIG. 8 is a plan view of a relevant part of a mounting structure according to Embodiment 3 of the present invention, from which an electronic component has been removed.
Figure 9:
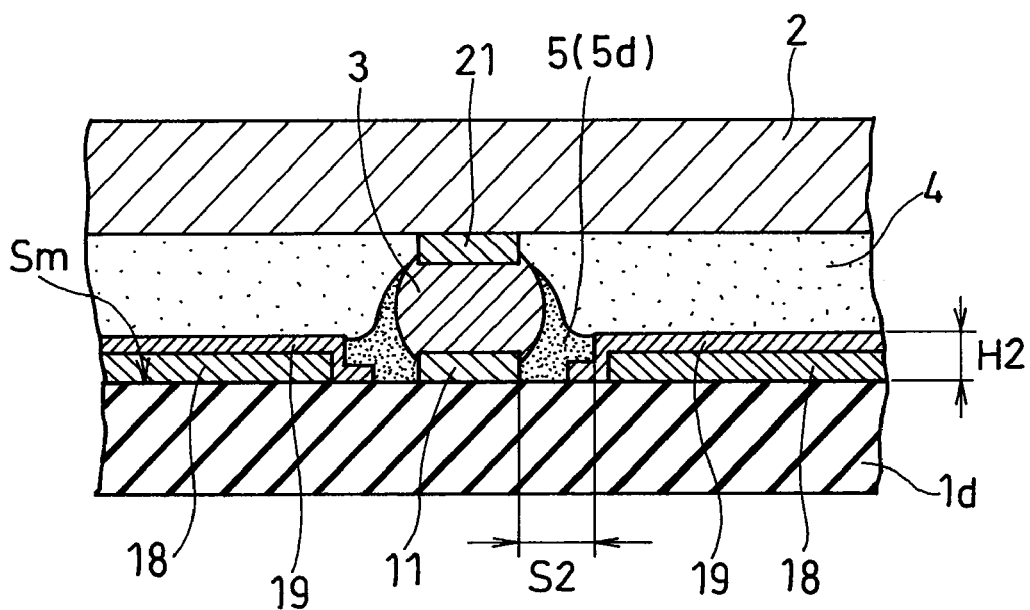
FIG. 9 is a cross-sectional view of a relevant part of the mounting structure according to Embodiment 3, taken along the line IX-IX of FIG. 8.

A mounting structure according to Embodiment 3 of the present invention will be described with reference to FIGS. 8 and 9. FIG. 8 is a plan view of a rectangular cutout portion of a mounting structure MSd according to the present embodiment. From the mounting structure MSd shown in FIG. 8, an LGA package has been removed, as in the mounting structure of FIG. 1. FIG. 9 shows a cross section of the mounting structure MSd, taken along the IX-IX line of FIG. 8.

As in the mounting structure MSa shown in FIG. 1, lands 21 are formed in a matrix on the underside of an LGA package. Likewise, terminals 11 are formed in a matrix on the mounting surface Sm of a circuit board 1d. However, unlike the mounting structure MSa, two terminals 11 provided on the circuit board 1d are connected with a wire 17a, and a wire 17b extends from one of the terminals 11. In addition, a dummy electrode 18 is provided such that it surrounds the terminals 11 and the wires 17a and 17b with a spacing interposed therebetween. Furthermore, the surface of the dummy electrode 18 is covered with a solder resist film 19.

The dummy electrode 18 is formed by covering a region of the mounting surface Sm of the circuit board 1d with a copper foil except the terminals 11 and the wires 17a and 17b, and is provided for the purpose of increasing the strength of the circuit board 1d and improving high frequency characteristics. When the improvement of high frequency characteristics is desired, the dummy electrode 18 is grounded. If the wires 17a and 17b are not provided, the dummy electrode 18 is formed so as to surround the terminals 11 as with the ring-shaped wall 13 shown in FIG. 3.

The solder resist film 19 is formed by covering the surface of the copper foil with a resin so that the solder does not flow into areas other than the terminals 11 when the terminals 11 are soldered. Ordinarily, the thickness of the solder resist film 19 is 20 to 30 μm.

In the mounting structure MSa of Embodiment 1, the means for holding the flux 5 separated from the solder is formed by ring-shaped grooves or walls, whereas in the mounting structure MSd of the present embodiment, the means for holding the flux is formed by the dummy electrode 18 (and the solder resist film 19) that is disposed so as to surround the terminals 11.

Specifically, in the mounting structure MSd of the present embodiment, the dummy electrode 18 (and the solder resist film 19) provided for the purpose of increasing the strength of the circuit board and improving high frequency characteristics also serves as the means for holding flux. The flux 5 separated from the solder joint 3 during a reflow process flows into the groove formed by the dummy electrode 18 and the solder resist film 19, and is held therein. Therefore, it is possible to prevent the flux from spreading over the mounting surface Sm of the circuit board 1d.

The solder resist film 19 is not an indispensable element as the means for holding flux. However, the capacity of the groove is increased by covering the surface of the dummy electrode 18 by the solder resist film 19 with a certain degree of thickness. In this sense, the solder resist film 19 is part of the flux holding means.

Furthermore, in the mounting surface Sm of the circuit board 1d that is covered with the solder resist film 19, flux can be held also in a portion between the wire 17a and the dummy electrode 18 and a portion between the wire 17b and the dummy electrode 18. The groove formed by these portions is slightly shallow due to the presence of the solder resist film 19, but there is no problem if the amount of flux held is small. An end of the groove (on the right side of FIG. 8) formed by the wire 17b and the dummy electrode 18 is open, and thus there is a possibility that flux might leak to the outside from this portion. In order to avoid such leakage, it is necessary to take measures such as increasing the thickness of that portion of the solder resist film 19.

The height H2 from the mounting surface Sm of the circuit board 1d to the upper surface of the solder resist film 19, and the spacing S2 between the terminal 11 and the solder resist film 19 can be set as appropriate according to the amount of flux 5 held, as in the ring-shaped grooves 12 of Embodiment 1.

A method for producing the circuit board 1d will be described next with reference to FIG. 10. First, a wiring pattern is formed. As shown in (A) of FIG. 10, a copper foil is attached onto one surface of a release film 30, and then the copper foil is subjected to a photolithography step and an etching step, forming a wiring pattern that includes a terminal 11 and a dummy electrode 18. As the release film 30, for example, a film made of polyethylene terephthalate or polyphenylene sulfide can be used.

Figure 10:
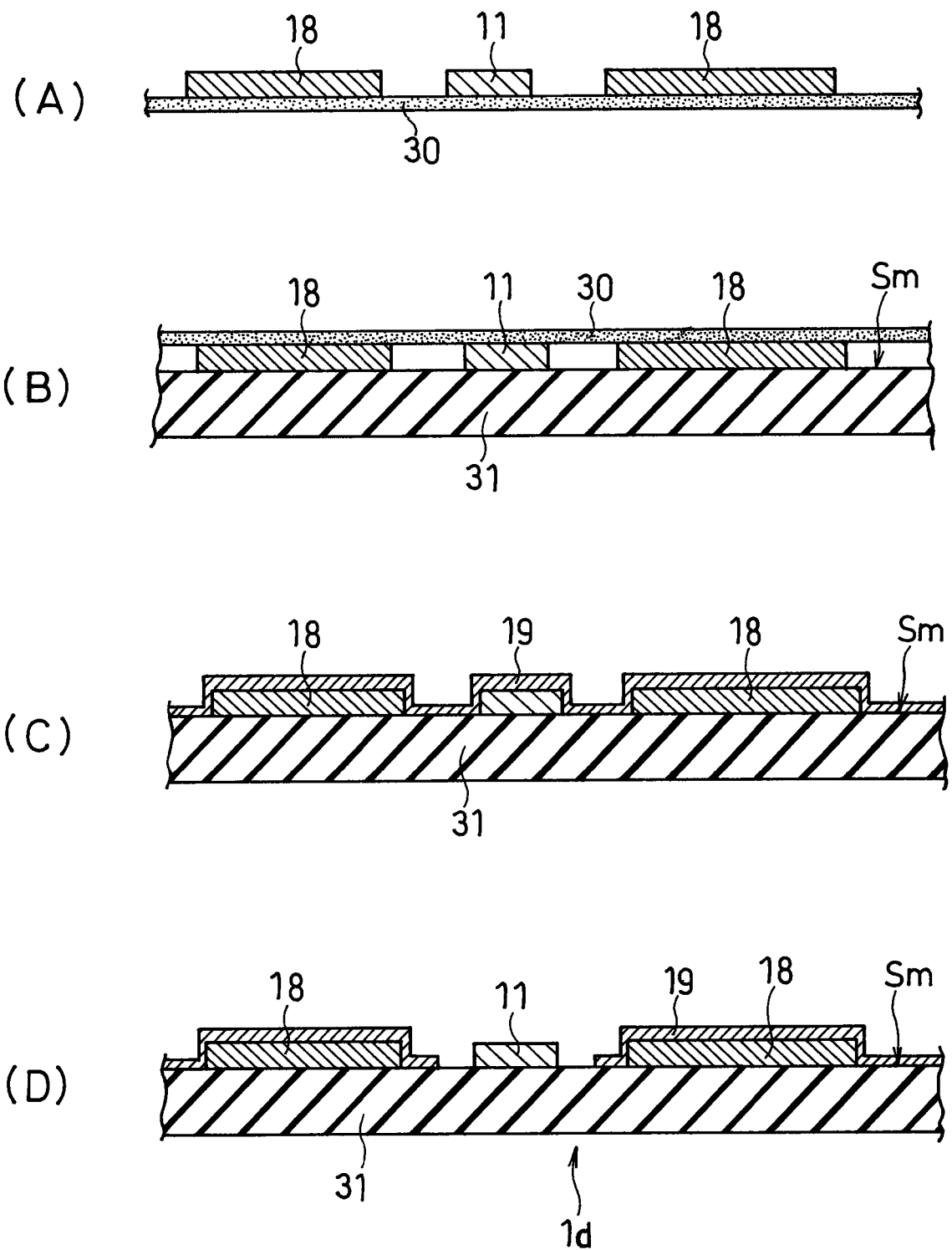
FIG. 10 is a cross-sectional view of a relevant part showing a production process of a circuit board used in the mounting structure according to Embodiment 3.

Next, as shown in (B) of FIG. 10, the wiring pattern (terminal 11, dummy electrode 18) formed on the release film 30 is positioned on the mounting surface Sm of a circuit substrate 31 that has been prepared in advance, and then they are bonded together. After that, the release film 30 is separated from the wiring pattern. Inside the circuit substrate 31, three-dimensional wiring that includes through holes is formed, but it is omitted in the drawings.

Next, as shown in (C) of FIG. 10, a solder resist is applied onto the mounting surface Sm of the circuit substrate 31 on which the wiring pattern (terminal 11, dummy electrode 18) is formed by screen printing to form a solder resist film having a predetermined thickness.

Next, as shown in (D) of FIG. 10, the solder resist film 19 formed on the terminal 11 is removed by a photolithography step and an etching step.

An LGA package 2 is soldered onto a circuit board 1d thus produced in the same manner as described in Embodiment 1 to obtain a mounting structure MSd.

In the mounting structure MSd of the present embodiment, because the dummy electrode 18 (and the solder resist film 19) provided for the purpose of increasing the strength of the circuit board and improving high frequency characteristics serves also as a means for holding flux, and there is no need to add an additional step to the production process of the circuit board 1d, the manufacture cost of the mounting structure MSd can be suppressed, which is a great advantage.

As described above, in the mounting structure according to the present invention, as a means for holding flux separated from the solder during a reflow process, a groove or wall is provided to the mounting surface of a circuit board. Accordingly, only by adding a simple configuration to existing mounting structures or by slightly modifying the shape of existing mounting structures, it is possible to prevent flux from spreading onto the mounting surface of the circuit board. Consequently, a sufficient connecting strength between the circuit board and the electronic component achieved by underfill can be secured, and the function for retaining the shape of the solder joints by the underfill can be achieved.

Although the embodiments given above have been described in the context of the electronic component being an LGA package, the present invention is not limited to that context. It is of course possible to apply the present invention to electronic components that include other packages such as a BGA (ball grid array) and a CSP (chip size package).

The present invention is applicable to a wide variety of mounting structures including a mounting structure in which a surface-mount type electronic component such as LGA, BGA, CSP is mounted on a circuit board.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A mounting structure, comprising:
   a flat electronic component including a plurality of lands provided on the undersurface of said electronic component, and
   a circuit board including a plurality of terminals provided on the mounting surface of said circuit board so as to correspond respectively to said plurality of lands, said plurality of terminals and said plurality of lands being respectively bonded together with a solder,
   wherein said circuit board further comprises a flux holding means for holding a flux separated from said solder, said flux holding means being provided in the proximity of at least one of said plurality of terminals of said circuit board,
   said flux holding means is a dummy electrode disposed so as to surround at least one of said plurality of terminals, and
   said dummy electrode is disposed on the whole area of said circuit board excluding said terminals and said lands.

2. The mounting structure in accordance with claim 1, wherein said flux holding means is a ring-shaped groove formed around at least one of said plurality of terminals.

3. The mounting structure in accordance with claim 1, wherein said flux holding means comprises ring-shaped grooves formed around at least two of said plurality of terminals, and a rectangular groove connecting said ring-shaped grooves.

4. The mounting structure in accordance with claim 1, wherein said flux holding means is a ring-shaped wall formed around at least one of said plurality of terminals.

5. The mounting structure in accordance with claim 1, wherein said flux holding means comprises ring-shaped walls formed around at least two of said plurality of terminals, and two linear walls connecting said ring-shaped walls.

6. The mounting structure in accordance with claim 1, wherein the surface of said dummy electrode is covered with a solder resist film.

7. The mounting structure in accordance with claim 1, wherein the undersurface of said electronic component and the mounting surface of said circuit board are connected with underfill filling the gap between the undersurface of said electronic component and the mounting surface of said circuit board.

8. The mounting structure in accordance with claim 7, wherein said solder is fixed by said underfill that has been cured so as to conform to the side shape of said solder.

9. A circuit board for forming a mounting structure together with a flat electronic component, the circuit board comprising a plurality of terminals provided on the mounting surface of said circuit board so as to correspond respectively to a plurality of lands provided on the undersurface of said flat electronic component, wherein said circuit board further comprises a flux holding means for holding a flux separated from a solder used for bonding said plurality of terminals and said plurality of lands together, said flux holding means being provided in the proximity of at least one of said plurality of terminals, said flux holding means is a dummy electrode disposed so as to surround at least one of said plurality of terminals, and said dummy electrode is disposed on the whole area of said circuit board excluding said terminals and said lands.

10. The circuit board in accordance with claim 9, wherein said flux holding means is a ring-shaped groove formed around at least one of said plurality of terminals.

11. The circuit board in accordance with claim 9, wherein said flux holding means comprises ring-shaped grooves formed around at least two of said plurality of terminals, and a rectangular groove connecting said ring-shaped grooves.

12. The circuit board in accordance with claim 9, wherein said flux holding means is a ring-shaped wall formed around at least one of said plurality of terminals.

13. The circuit board in accordance with claim 9, wherein said flux holding means comprises ring-shaped walls formed around at least two of said plurality of terminals, and two linear walls connecting said ring-shaped walls.

14. The circuit board in accordance with claim 9, wherein the surface of said dummy electrode is covered with a solder resist film.

* * * * *